US009232627B2

(12) United States Patent
Habu

(10) Patent No.: US 9,232,627 B2
(45) Date of Patent: Jan. 5, 2016

(54) RADIO-FREQUENCY OSCILLATION CIRCUIT

(71) Applicant: SHIMADZU CORPORATION, Kyoto-shi, Kyoto (JP)

(72) Inventor: Toshiya Habu, Kyoto (JP)

(73) Assignee: SHIMADZU CORPORATION, Kyoto (JP)

(*) Notice: Subject to any disclaimer, the term of this patent is extended or adjusted under 35 U.S.C. 154(b) by 0 days.

(21) Appl. No.: 14/633,336

(22) Filed: Feb. 27, 2015

(65) Prior Publication Data
US 2015/0249429 A1 Sep. 3, 2015

(30) Foreign Application Priority Data

Feb. 28, 2014 (JP) ................. 2014-039114

(51) Int. Cl.
H05H 1/46 (2006.01)
H03B 5/12 (2006.01)
H03B 5/06 (2006.01)
H03L 3/00 (2006.01)
H05H 1/24 (2006.01)
H05H 1/30 (2006.01)
H05H 1/36 (2006.01)

(52) U.S. Cl.
CPC . *H05H 1/46* (2013.01); *H03B 5/06* (2013.01); *H03B 5/1218* (2013.01); *H03B 5/1228* (2013.01); *H03B 5/1296* (2013.01); *H03L 3/00* (2013.01); *H05H 1/24* (2013.01); *H05H 1/30* (2013.01); *H05H 1/36* (2013.01); *H03B 2200/0094* (2013.01); *H05H 2001/4652* (2013.01); *H05H 2001/4682* (2013.01)

(58) Field of Classification Search
CPC ............ H03L 3/00; H03B 5/1296; H03B 2200/0006; H03B 2200/0094; H03B 5/06; H01J 49/105; H05H 1/30; H05H 1/46; H05H 2001/4682; H05H 2001/4645; H05H 2001/4652
USPC .................. 331/117 FE, 167, 172, 173, 184; 356/316; 315/111.51, 111.21, 111.41, 315/70

See application file for complete search history.

(56) References Cited

U.S. PATENT DOCUMENTS

| 6,246,173 | B1* | 6/2001 | Fischer | .............. H05B 41/2825 315/219 |
| 7,852,471 | B2 | 12/2010 | Hosemans | |
| 8,624,684 | B2* | 1/2014 | Czimmek | ............ H03K 5/1536 219/205 |
| 2010/0231313 | A1* | 9/2010 | Kitamura | .................. H05B 6/04 331/117 FE |
| 2012/0268220 | A1* | 10/2012 | Czimmek | ................ H05B 6/04 331/117 FE |
| 2013/0265810 | A1* | 10/2013 | Kawato | .................... H05H 1/46 363/131 |

FOREIGN PATENT DOCUMENTS

JP    10-214698 A    8/1998
JP    2009-537829 A    10/2009

* cited by examiner

Primary Examiner — Ryan Johnson
(74) Attorney, Agent, or Firm — Sughrue Mion, PLLC

(57) ABSTRACT

A starter is provided for a self-oscillating radio frequency oscillation circuit for high-power applications used for plasma generation in an ICP emission spectrometer or for other purposes. A secondary winding of a starting transformer is arranged in an LC resonance circuit including an induction coil, capacitor and other elements. A starter, e.g. a Clapp oscillator circuit, is connected to a primary winding magnetically coupled with the secondary winding. A radio-frequency current is induced in the LC resonance circuit by energizing the starter for a certain period of time in a starting phase. As a result, electric current flows through the secondary windings in a full-bridge drive circuit which are magnetically coupled with primary windings, whereby voltage is developed between the gate and source of MOSFETs, causing these MOSFETs to begin an ON/OFF operation, whereby the self-oscillation is started.

3 Claims, 2 Drawing Sheets

RADIO-FREQUENCY OSCILLATION CIRCUIT

TECHNICAL FIELD

The present invention relates to a radio-frequency oscillation circuit, and more specifically, to a method for starting a radio-frequency oscillation for high-power applications. The radio-frequency oscillation circuit according to the present invention is suitable as a radio-frequency power source for generating and maintaining plasma in an analyzing system or a manufacturing and processing system using plasma, such as an inductively coupled plasma (ICP) emission spectrometer or a plasma chemical vapor deposition (CVD) system.

BACKGROUND ART

In an inductively coupled plasma (ICP) emission spectrometer, a plasma-generating gas (e.g. argon) is ionized by an electromagnetic field created by supplying radio-frequency power to an induction coil. While the obtained plasma is maintained by the electromagnetic field, a sample atom is introduced into the plasma. The sample atom is excited by the plasma, and when the excited atom returns to a lower energy level, it emits light whose wavelength is specific to the atom. By performing a spectrometry of this light, a qualitative and quantitative determination of the sample is performed.

In an ICP emission spectrometer, in order to supply radio-frequency power to the plasma, a configuration is commonly used in which an LC resonance circuit formed by an induction coil and a capacitor is driven by a radio-frequency power source which supplies, for example, radio-frequency power of several hundred watts to several kilowatts at a frequency of 27 MHz. To produce an oscillation with high efficiency in such a radio-frequency oscillation circuit, the load impedance seen from the radio-frequency power source should preferably be constant, and furthermore, the impedance should be matched with the optimum load impedance of the power source. However, when plasma is generated by passing a radio-frequency current through the induction coil, the impedance of the induction coil changes due to the effect of the induction current caused by the movement of charged particles in the plasma. The impedance of the induction coil also changes with a change in the state of the plasma, which can occur depending on the state of the plasma-generating gas or that of the sample to be analyzed, the amount of power supplied to the plasma, and other factors. Such a change in the impedance of the induction coil leads to a change in the load impedance seen from the radio-frequency power source, causing the impedance matching to deviate from the optimum state.

To overcome this problem, a self-oscillating circuit is commonly used, in which the LC resonance circuit formed by the induction coil and the capacitor is driven by a switching circuit, such as a half-bridge or full-bridge circuit including switching elements, with a positive feedback of an electric current from the LC resonance circuit to a control terminal of the switching element via a transformer or the like (see Patent Literatures 1-3). In such a self-oscillating circuit, when the impedance of the induction coil changes depending on a change in the state of the plasma, the oscillation frequency of the LC resonance circuit automatically changes. As a result, the load impedance seen from the switching circuit is constantly maintained at optimum levels, allowing the oscillation to continue with high efficiency without requiring any special control or command from the outside.

In a self-oscillating circuit commonly used in low-power applications, when a power supply to the radio-frequency LC oscillation circuit is started by energizing a power source, the small amount of noise in the DC power source or oscillation circuit is amplified by the positive feedback loop, whereby an oscillation is started and sustained. While the principle of sustaining the oscillation in a self-oscillating radio-frequency oscillation circuit for the previously described plasma generation is also the same, the situation is different when starting the oscillation. This is due to the following fact: In the self-oscillating circuit for low-power applications, the switching element, such as MOSFET, is driven in an operation range comparatively close to the linear range and the ON/OFF operation can be easily started, whereas in a self-oscillating circuit for producing a high power of several kilowatts, the switching element is driven in an operation range close to the saturation range and high power is needed to start the ON/OFF operation. Therefore, in many cases, merely energizing the power source does not immediately lead to the state of oscillation. This means that some device for starting the oscillation circuit is necessary.

To address these problems, the radio-frequency oscillation circuits described in Patent Literatures 1-3 have adopted a technique in which a DC bias circuit is connected to the control terminal of the switching element; after the main power source is energized, the power current is monitored and the DC bias voltage is gradually increased until the onset of an oscillation is detected. However, if the DC bias voltage is increased to an excessively high level, the switching element will be completely turned on and will allow a considerable amount of current to pass through, which may possibly damage the element. Therefore, the DC bias voltage should be controlled according to the gain, input-voltage threshold and other properties of the switching element to prevent the voltage from being excessively high. However, since those properties considerably vary from one element to another, a complex control is needed to start the radio-frequency oscillation in a stable manner.

Besides, in a configuration which drives the LC resonance circuit by a full-bridge circuit as described in Patent Literature 2, the DC bias circuit needs to be provided for each of the four switching elements. Furthermore, two of the four DC bias circuits must be a circuit floated from the ground potential, which means the device cost will be considerably high.

As another startup method, it is possible to connect a switching element dedicated to startup parallel to the switching element which operates during the steady-state oscillation, to compulsorily start the oscillation by driving the switching element dedicated to startup only during a certain period of time in the starting phase. According to this startup method, the previously described problem due to the addition of the DC bias circuit does not occur. However, connecting the switching element dedicated to startup parallel to the main switching element causes an equivalent increase in the output capacitance of the switching elements. Since the frequency characteristics of a switching element significantly depends on its output capacitance, the increase in the output capacitance deteriorates the frequency characteristics and lower the gain in the radio-frequency range, making it difficult to ensure an adequate amplitude of oscillation.

CITATION LIST

Patent Literature

Patent Literature 1: JP 10-214698 A
Patent Literature 2: JP 2009-537829 A
Patent Literature 3: U.S. Pat. No. 7,852,471 B

SUMMARY OF INVENTION

Technical Problem

The present invention has been developed in view of the previously described problems, and its objective is to provide a radio-frequency oscillation circuit capable of starting a self-oscillation in a stable manner and at a low cost, while providing neither a DC bias circuit for applying a DC bias voltage to the control terminal of the switching element nor a switching element dedicated to startup parallel to the main switching element.

Solution to Problem

The present invention aimed at solving the previously described problem is a self-oscillating radio-frequency oscillation circuit, comprising: a DC voltage source; an LC resonance circuit including a coil and a capacitor; a switching circuit including a switching element for switching a DC power supplied from the DC voltage source and for supplying the power to the LC resonance circuit; and a transformer formed by a primary winding included in the LC resonance circuit and a secondary winding connected to the control terminal of the switching element so as to turn on and off this switching element, the radio-frequency oscillation circuit further including:

a) a starting transformer having a secondary winding connected inside the LC resonance circuit; and b) a starter for supplying a primary winding of the starting transformer with a radio-frequency current whose frequency is close to the resonant frequency of the LC resonance circuit during a certain period of time in a starting phase, so as to start a self-oscillation in the radio-frequency oscillation circuit.

In the case where the radio-frequency oscillation circuit according to the present invention is used for plasma generation in an ICP emission spectrometer, the coil included in the LC oscillation circuit is the induction coil for plasma generation.

In the radio-frequency oscillation circuit according to the present invention, the switching circuit is, for example, a half-bridge or full-bridge drive circuit using a plurality of switching elements. The switching element is normally a semiconductor switching element, which is typically MOSFET.

The starter may have any configuration as long as it can produce a signal whose frequency is close to the resonant frequency of the LC resonance circuit. For example, a Clapp oscillator circuit having the primary winding of the starting transformer incorporated in the resonance circuit may be used.

That is to say, the radio-frequency oscillation circuit according to the present invention does not only include the main LC resonance circuit in which, for example, an induction coil for plasma generation is incorporated, but also an oscillation circuit as a starter, which is magnetically coupled with a portion of the LC resonance circuit, or in other words, electrically insulated from the LC resonance circuit. This oscillation circuit is operated only during a certain period of time in the starting phase, to supply a radio-frequency current to the main LC resonance circuit and promote its self-oscillation. After a stable state of oscillation is achieved by the main LC resonance circuit and the switching circuit, the oscillation by the starter can be discontinued to virtually disconnect it.

After the self-oscillation in the radio-frequency oscillation circuit is started by the starting operation by the starter, the electric current flowing in the main LC resonance circuit due to the self-oscillation may induce an excessive amount of current in the oscillation circuit of the starter in reverse through the starting transformer, which may eventually damage the element in the oscillation circuit. Accordingly, in a preferable configuration for avoiding this problem, the starter is a radio-frequency LC oscillation circuit whose resonance circuit includes the primary winding of the starting transformer, and furthermore, the radio-frequency oscillation circuit further includes a variable resistive element for changing the resistance value of the resonance circuit in the radio-frequency LC oscillation circuit to a greater value after the self-oscillation is started.

Specifically, the variable resistive element may consist of, for example, a PIN diode included in the resonance circuit and a voltage supplier for applying a bias voltage to the diode, the voltage supplier applying a forward bias voltage to the PIN diode during the starting phase and then switching it to a reverse bias voltage after the self-oscillation is started.

Advantageous Effects of the Invention

The radio-frequency oscillation circuit according to the present invention does not require any DC bias circuit for applying a gradually increasing DC bias voltage to the control terminal of the switching element. Accordingly, there is no possibility that the switching element will become completely turned on by an excessively high DC bias voltage and eventually damaged. Therefore, the oscillation can be started in a stable manner. Furthermore, the radio-frequency oscillation circuit according to the present invention can be produced at a low cost, since it requires only one starter regardless of whether the switching circuit is a half-bridge drive circuit or a full-bridge drive circuit.

Furthermore, the radio-frequency oscillation circuit according to the present invention requires no switching element dedicated to startup provided parallel to the main switching element, so that there will be no increase in the output capacitance of the switching element and consequently no deterioration of the frequency characteristics. Therefore, an adequate amplitude of oscillation can be achieved even if the resonant frequency is high.

DESCRIPTION OF EMBODIMENTS

As one embodiment of the present invention, a radio-frequency oscillation circuit used for plasma generation in an ICP emission spectrometer is hereinafter described with reference to the attached drawings.

Figure 1:
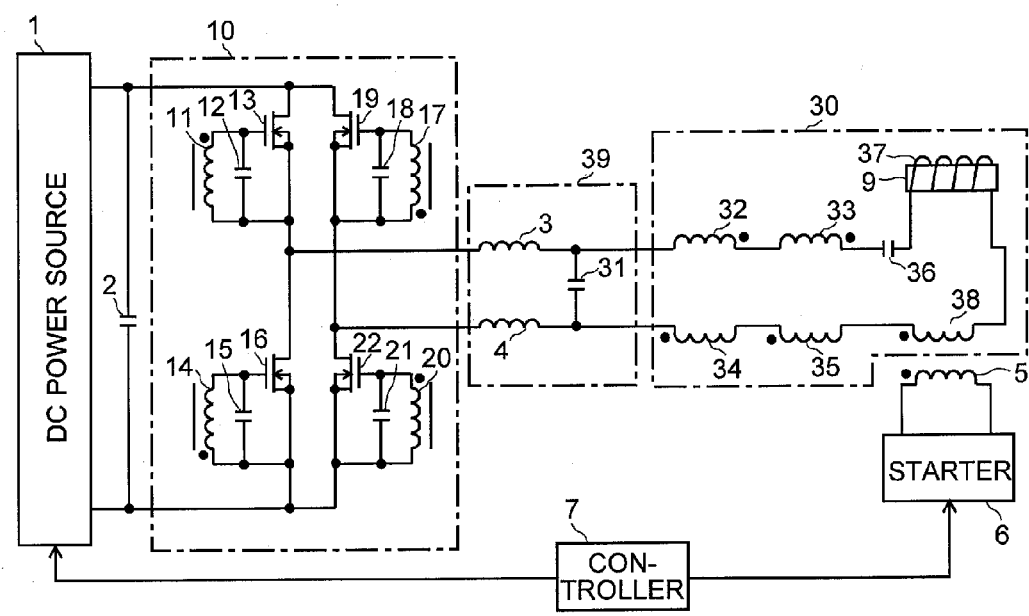
FIG. 1 is a configuration diagram of a radio-frequency oscillation circuit according to one embodiment of the present invention.
Figure 2:
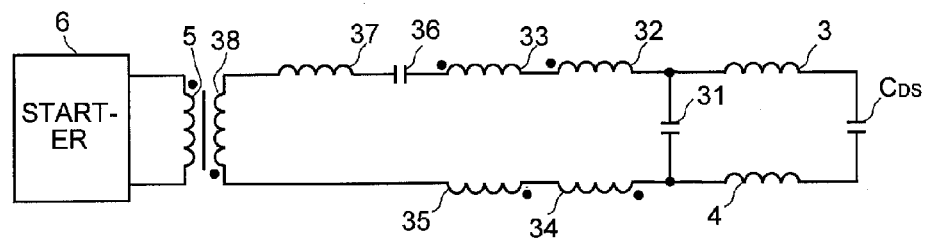
FIG. 2 is a diagram showing an equivalent circuit of the radio-frequency oscillation circuit shown in FIG. 1.
Figure 3:
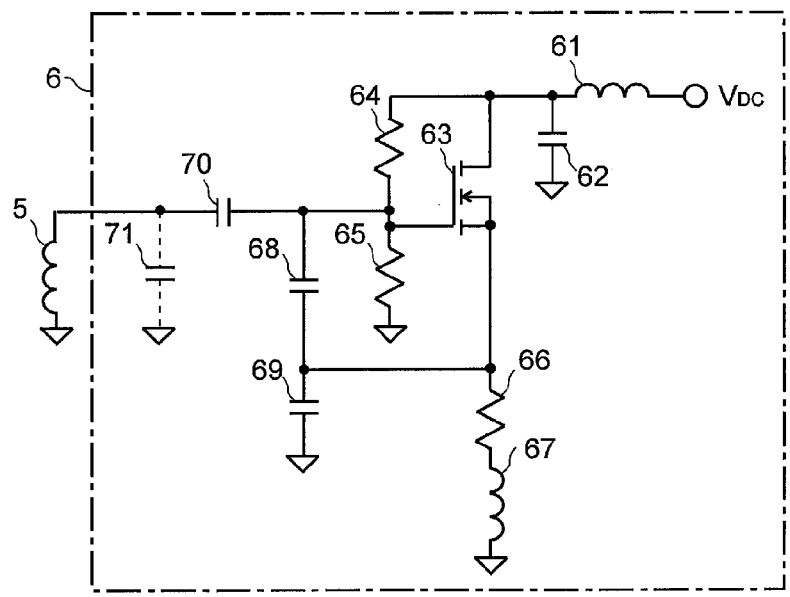
FIG. 3 is a diagram showing one example of the circuit configuration of the starter in FIG. 1.

FIG. 1 is a configuration diagram of the radio-frequency oscillation circuit of the present embodiment, FIG. 2 is a diagram showing an equivalent circuit of the radio-frequency oscillation circuit of the present embodiment, and FIG. 3 is a diagram showing one example of the circuit configuration of the starter in FIG. 1.

An induction coil 37 wound around a plasma torch 9 of the ICP emission spectrometer to generate plasma in this plasma torch 9 is the target to which a radio-frequency current needs to be supplied in the present radio-frequency oscillation circuit. A capacitor 36 and four primary windings 32, 33, 34 and 35 of a feedback transformer are connected in series with this induction coil 37. Also connected in series with these circuit elements is a secondary winding 38 of a starting transformer, whereby an LC resonance circuit 30 is formed. In addition to the induction coil 37, the LC resonance circuit 30 includes inductances due to the primary windings 32, 33, 34 and 35 of the feedback transformer as well as that of the secondary winding 38 of the starting transformer. However, since the inductance of the induction coil 37 as compared to the other inductances is sufficiently high, it is possible to consider that the inductance of the induction coil 37 is dominant among the inductances which determine the resonant frequency of the LC resonance circuit 30.

A full-bridge drive circuit 10 is connected to the output terminal of a DC power source 1 via a parallel-connected bypass capacitor 2. The full-bridge drive circuit 10 has two parallel-connected series circuits, one consisting of two MOSFETs 13 and 16 and the other consisting of two MOSFETs 19 and 22. A capacitor 12, 15, 18 or 21 and a secondary winding 11, 14, 17 or 20 of the feedback transformer are connected between the gate terminal and the source terminal of each of the four MOSFETs 13, 16, 19 and 22, respectively. These secondary windings 11, 14, 17 and 20 of the feedback transformer are magnetically coupled with the primary windings 32, 33, 34 and 35 of the feedback transformer included in the LC resonance circuit 30, respectively. The polarities of the primary windings 32, 33, 34 and 35 of the feedback transformer, and those of the secondary windings 11, 14, 17 and 20, are determined so that diagonal MOSFETs among the four MOSFETs 13, 16, 19 and 22 forming the full-bridge configuration constitute a pair, and so that the two pairs of MOSFETs alternately turn on and off.

The full-bridge drive circuit 10 and the LC resonance circuit 30 are connected to each other via inductors 3 and 4 as well as a capacitor 31 in an impedance conversion circuit 39, whereby the load impedance seen from the full-bridge drive circuit 10 is maintained in an optimum state.

A starter 6 is connected to a primary winding 5 magnetically coupled with the secondary winding 38 of the starting transformer included in the LC resonance circuit 30. The starter 6 and the DC power source 1 are controlled by a controller 7. Actually, the secondary winding 38 of the starting transformer is not a coil-like winding structure but a simple, straight transmission line, and the primary winding 5 may have an annular structure wound around this transmission line. For example, upon receiving a startup command from outside, the controller 7 performs an energizing operation for allowing the supply of power from the output terminal of the DC power source 1, and supplies the starter 6 with a drive power to make the starter 6 operate.

As shown in FIG. 3, the starter 6 is a Clapp oscillator circuit with the primary winding 5 of the starting transformer incorporated in an LC resonance circuit. More specifically, one capacitor 70 having a variable capacitance and two capacitors 68 and 69 having fixed capacitances are connected in series with the primary winding 5, whereby the loop of the LC resonance circuit is formed. Another capacitor 71 may be connected to the primary winding 5 in parallel, for a reason which will be described later. The line between the two capacitors 68 and 69 is connected to the source terminal of a MOSFET 63. This source terminal is connected to a ground via a resister 66 and an inductor 67. A DC voltage $V_{DC}$ is applied to the drain terminal of the MOSFET 63 through a filter consisting of an inductor 61 and a capacitor 62, while a voltage obtained by a resistive division of the DC voltage $V_{DC}$ using two resistors 64 and 65 is applied to the gate terminal of the MOSFET 63. Furthermore, this gate terminal is connected to the line between the capacitors 70 and 68 in the LC resonance circuit.

The circuit configuration of this starter 6 is a typical Clapp oscillator circuit, whose operation principle is generally known and hence will not be described in detail. By previously determining the capacitance of the capacitor 70 at a value lower than those of the capacitors 68 and 69 constituting a potential divider, and by adjusting the capacitance of the capacitor 70, it is possible to adjust the oscillation frequency of the resonance circuit while ensuring a stable oscillation. Accordingly, the oscillation frequency can be previously adjusted so that it will be close to the frequency of the self-oscillation in the LC resonance circuit 30.

In the case where the capacitor 71 is additionally arranged parallel to the primary winding 5 as shown by the broken line in FIG. 3, the oscillation frequency depends on the sum of the capacitances of the capacitors 70 and 71. Accordingly, the oscillation frequency itself does not change as long as the sum of the capacitances of the capacitors 70 and 71 is the same. However, as the capacitance of the capacitor 71 becomes higher and higher than that of the capacitor 70, the impedance of the resonance circuit also becomes higher and its operation mode becomes the voltage mode. Conversely, as the capacitance of the capacitor 71 becomes lower and lower than that of the capacitor 70, the impedance of the resonance circuit also becomes lower and its operation mode becomes the current mode. For example, in the case where the withstand voltage of the MOSFET 63 is comparatively low, if the resonance circuit is operated in the voltage mode, a voltage which exceeds the withstand voltage may possibly act on the MOSFET 63 and damage it. Accordingly, particularly when the resonance circuit should be operated in the voltage mode, it is preferable to arrange the capacitor 71 and suitably adjust the capacitances of the two capacitors 70 and 71 for the characteristics of the MOSFET 63.

In the circuit configuration shown in FIG. 1, on the assumption that the capacitance of the bypass capacitor 2 is adequately higher than the output capacitance $C_{DS}$ of the four MOSFETS 13, 16, 19 and 22, the circuit configuration of FIG. 1 before the onset of the self-oscillation can be represented by the equivalent circuit shown in FIG. 2. The aforementioned assumption is reasonable, because a capacitor having a high capacitance is normally used as the bypass capacitor 2. It should be noted that all the MOSFETs in FIG. 2 are assumed to have equal output capacitances. From this equivalent circuit, it can be understood that a large radio-frequency current can be induced in the resonance circuit from the starter 6 by setting the oscillation frequency of the starter 6 close to the resonant frequency of the right-hand resonance circuit shown in FIG. 2.

Next, the operation from the startup to the cease of oscillation in the radio-frequency oscillation circuit of the present embodiment is described. When a command for starting plasma generation for an analysis in the ICP emission spectrometer is issued, the controller 7 receives this command and begins to supply DC power from the DC power source 1 to the full-bridge drive circuit 10. However, merely beginning the DC power supply to the full-bridge drive circuit 10 does not immediately generate voltage between the gate and source of the MOSFETs 13, 16, 19 and 22, and the self-oscillation in the radio-frequency oscillation circuit does not occur. Therefore, the controller 7 also begins to supply of DC voltage $V_{DC}$ to energize the starter 6. The supply of DC voltage $V_{DC}$ develops voltage between the gate and source of the MOSFET 63, whereby the MOSFET 63 is driven. As a result, the resonance circuit including the primary winding 5, capacitor 70 and other elements begins to oscillate at a preset frequency, producing a flow of radio-frequency current through the primary winding 5.

The flow of radio-frequency current through the primary winding 5 induces a radio-frequency current in the secondary winding 38. Since the resonant frequency of the oscillation circuit in the starter 6 is approximately equal to that of the LC resonance circuit 30, the radio-frequency current in the LC resonance circuit 30 reaches a predetermined value within approximately a few to ten cycles. This radio-frequency current also flows through the primary windings 32, 33, 34 and 35 included in the same LC resonance circuit 30, whereby a current is also induced in the secondary windings 11, 14, 17 and 20 which are magnetically coupled with those primary windings, respectively. As a result, a sufficient amount of feedback voltage is developed between the gate and source of the MOSFETs 13, 16, 19 and 22, which causes the MOSFETs 13, 16, 19 and 22 to begin the ON/OFF operation. By this operation, a radio-frequency power is supplied from the full-bridge drive circuit 10 to the LC resonance circuit 30, so that the oscillation in the LC resonance circuit 30 continues in a stable form even if the oscillation in the starter 6 is discontinued. Accordingly, after the elapse of a predetermined period of time from the startup, the controller 7 discontinues the supply of the DC voltage $V_{DC}$ to the starter 6 to terminate the operation of the starter 6. Normally, the starter 6 only needs to operate for a considerably short period of time; for example, 10 μs or so is sufficient.

While the radio-frequency oscillation circuit is oscillating in the previously described manner, a radio-frequency current flows through the induction coil 37 and creates a radio-frequency electromagnetic field in the plasma torch 9. Then, ionization of the plasma-generating gas introduced in the plasma torch 9 is triggered through an igniter or similar device (not shown). As a result, a stable ionization of the plasma-generating gas occurs in the plasma torch 9, forming a cloud of plasma. The plasma in the plasma torch 9 can be extinguished by decreasing the DC voltage fed from the DC power source 1 to the full-bridge drive circuit 10 to zero or a similar level that is too low to drive the MOSFETs 13, 16, 19 and 22. This operation decreases the radio-frequency current flowing through the induction coil 37 and prevents a feedback voltage high enough to turn on the MOSFETs 13, 16, 19 and 22 from being developed between the gate and source of the MOSFETs 13, 16, 19 and 22, so that the oscillation in the radio-frequency oscillation circuit ceases.

As described to this point, in the radio-frequency oscillation circuit of the present embodiment, the oscillation in the radio-frequency oscillation circuit is promoted during the starting phase by inducing a radio-frequency current in the LC resonance circuit 30 from the starter 6 through the primary winding 5 magnetically coupled with the secondary winding 38 in the LC resonance circuit 30 which includes the induction coil 37. The starter 6 is simple in configuration and comparatively inexpensive yet does not deteriorate the frequency characteristics of the radio-frequency oscillation circuit. Accordingly, it is possible to start the radio-frequency oscillation circuit in a stable manner and at a low cost, and to sustain its self-oscillation.

Figure 4:
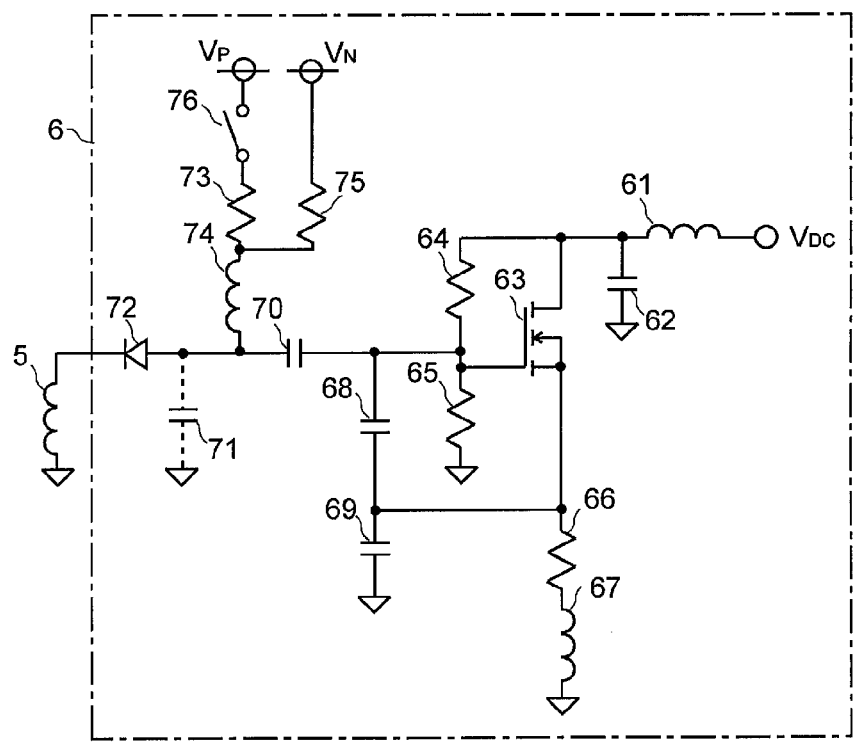
FIG. 4 is a diagram showing another example of the circuit configuration of the starter in FIG. 1.

In some cases, when the radio-frequency oscillation circuit begins self-oscillation as a result of the starting operation by the starter 6, a high level of current is induced through the primary winding 5 of the starting transformer by the current flowing in the LC resonance circuit 30. If the resistance in the resonance circuit of the starter 6 is low, the induced current may possibly reach an excessively high level and break the MOSFET 63 or other elements. Actually, the current induced in the primary winding 5 of the starting transformer will not significantly increase, since the frequency of the current flowing in the LC resonance circuit 30 changes due to a change in the impedance of the induction coil 37 after the plasma is formed in the plasma torch 9. Therefore, in practice, the aforementioned problem rarely occurs. However, in order to more assuredly avoid such a problem, the circuit configuration of the starter 6 may be modified as shown in FIG. 4. In FIG. 4, the components which are identical to those used in the configuration shown in FIG. 3 are denoted by the same numerals.

In this modified example, a PIN diode 72 is provided in series with the primary winding 5 of the starting transformer, and furthermore, a bias voltage is applied from positive and negative power lines $V_P$ and $V_N$ to the PIN diode 72 through resisters 73 and 75, an inductor 74 and a switch 76. As is commonly known, a PIN diode has a low resistance value and allows the passage of a radio-frequency current when biased in the forward direction, while conversely it has a high resistance value when biased in the reverse direction. Accordingly, it is preferable to turn on the switch 76 to apply a forward bias voltage and lower the resistance value of the PIN diode 72 during the starting phase, and then turn off the switch 76 to apply a reverse bias voltage and increase the resistance of the resonance circuit after the elapse of a predetermined length of time from the startup. By this operation, the aforementioned unwanted induction current through the starting transformer can be reduced to protect the circuit elements of the starter 6.

The previously described embodiment is one example of the present invention, and any change, modification, addition or the like appropriately made within the spirit of the present invention will naturally be included within the scope of claims of the present application.

For example, a half-bridge drive circuit may be employed in place of the full-bridge drive circuit used as the switching circuit for driving the LC resonance circuit in the previous embodiment. The starter 6 is not limited to the Clapp oscillator circuit; other forms of oscillation circuits, such as a Colpitts oscillator circuit, may also be used, although they are less stable.

REFERENCE SIGNS LIST

1 . . . DC Power Source
2 . . . Bypass Capacitor
3, 4, 61, 67, 74 . . . Inductor
5 . . . Primary Winding of Starting Transformer
6 . . . Starter
7 . . . Controller
9 . . . Plasma Torch
10 . . . Full-Bridge Drive Circuit
11, 14, 17, 20 . . . Secondary Winding of Feedback Transformer
12, 15, 18, 21, 31, 36, 62, 68, 70, 71 . . . Capacitor
13, 16, 19, 22, 63 . . . MOSFET
30 . . . LC Resonance Circuit
32, 33, 34, 35 . . . Primary Winding of Feedback Transformer
37 . . . Induction Coil
38 . . . Secondary Winding of Starting Transformer
39 . . . Impedance Conversion Circuit
64, 66, 73, 75 . . . Resister
72 . . . PIN Diode
76 . . . Switch

The invention claimed is:

1. A self-oscillating radio-frequency oscillation circuit, comprising: a DC voltage source; an LC resonance circuit including a coil and a capacitor; a switching circuit including a switching element for switching a DC power supplied from the DC voltage source and for supplying the power to the LC resonance circuit; and a transformer formed by a primary winding included in the LC resonance circuit and a secondary winding connected to a control terminal of the switching element so as to turn on and off this switching element, the radio-frequency oscillation circuit further comprising:

a) a starting transformer having a secondary winding connected inside the LC resonance circuit; and
  b) a starter for supplying a primary winding of the starting transformer with a radio-frequency current whose frequency is close to a resonant frequency of the LC resonance circuit during a certain period of time in a starting phase, so as to start a self-oscillation in the radio-frequency oscillation circuit.

2. The radio-frequency oscillation circuit according to claim 1, wherein:

the starter is a radio-frequency LC oscillation circuit whose resonance circuit includes the primary winding of the starting transformer.

3. The radio-frequency oscillation circuit according to claim 2, further comprising a variable resistive element for changing a resistance value of the resonance circuit in the radio-frequency LC oscillation circuit to a greater value after a self-oscillation is started.

* * * * *